United States Patent
Lee et al.

(10) Patent No.: US 9,496,679 B2
(45) Date of Patent: Nov. 15, 2016

(54) PACKAGING STRUCTURE FOR A LASER DIODE

(71) Applicant: Hou-Chieh Lee, Taoyuan County (TW)

(72) Inventors: Hou-Chieh Lee, Taoyuan County (TW); Hsun-Fu Lee, Taoyuan County (TW)

(73) Assignee: Hou-Chieh Lee, Taoyuan County (TW)

( * ) Notice: Subject to any disclaimer, the term of this patent is extended or adjusted under 35 U.S.C. 154(b) by 0 days.

(21) Appl. No.: 14/981,998

(22) Filed: Dec. 29, 2015

(65) Prior Publication Data

US 2016/0294157 A1    Oct. 6, 2016

(30) Foreign Application Priority Data

Mar. 31, 2015 (TW) .............................. 104204856 U

(51) Int. Cl.
*H01S 5/024* (2006.01)
*H01S 5/022* (2006.01)
*H01S 5/40* (2006.01)
*H01S 5/068* (2006.01)

(52) U.S. Cl.
CPC ....... *H01S 5/02469* (2013.01); *H01S 5/02248* (2013.01); *H01S 5/02252* (2013.01); *H01S 5/02272* (2013.01); *H01S 5/06825* (2013.01); *H01S 5/4025* (2013.01)

(58) Field of Classification Search
CPC ........... H01S 5/02469; H01S 5/02272; H01S 5/02248; H01S 5/06825; H01S 5/4025
See application file for complete search history.

(56) References Cited

U.S. PATENT DOCUMENTS

| | | | |
|---|---|---|---|
| 2005/0286580 A1* | 12/2005 | Oka | G11B 7/125 372/36 |
| 2014/0029637 A1* | 1/2014 | Schmidt | H01L 33/64 372/44.01 |
| 2015/0078412 A1* | 3/2015 | Pan | H01S 5/42 372/50.124 |

* cited by examiner

*Primary Examiner* — Dung Nguyen
(74) *Attorney, Agent, or Firm* — Hannah M. Tien

(57) ABSTRACT

The invention relates to a packaging structure for a laser diode, comprising an electrically insulated, heat-conducting board having an electronic circuit thereon; a laser diode chip mounted on the electronic circuit of the electrically insulated, heat-conducting board and having an anode and a cathode, respectively connected to an external soldering pad for external electrical connections; and a heat-conducting base installed on a surface of the electrically insulated, heat-conducting board to conduct the heat generated by the laser diode chip to the heat-conducting base through the electrically insulated, heat-conducting board, wherein the laser diode chip emits the light from an edge of the electrically insulated, heat-conducting board and the area of a faying plane between the electrically insulated, heat-conducting board and the heat-conducting base is adjusted depending on the power requirements of the laser diode, and the area of the faying plane is from 6 to 5,000 $mm^2$.

23 Claims, 6 Drawing Sheets

20

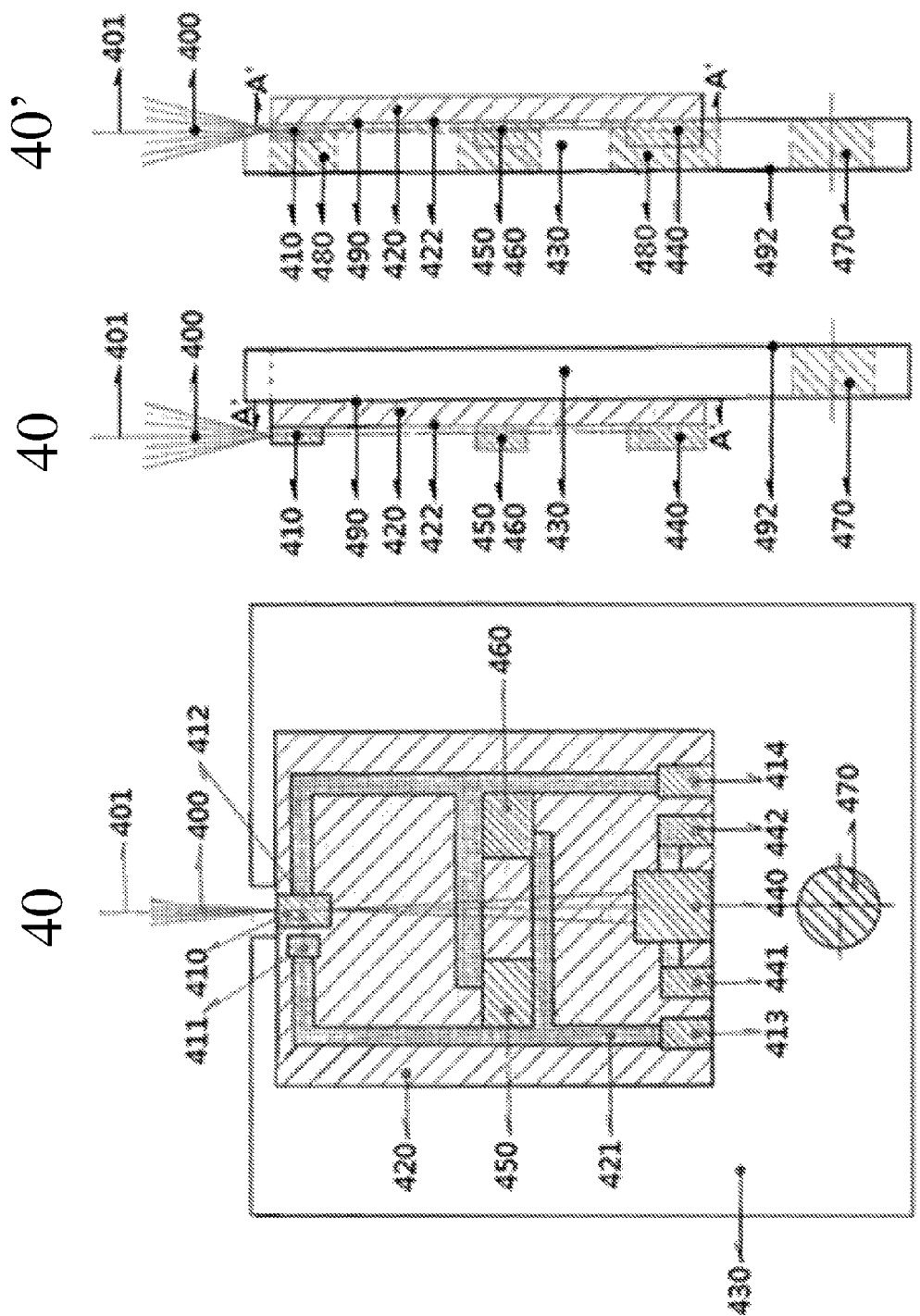

PACKAGING STRUCTURE FOR A LASER DIODE

CROSS-REFERENCES TO RELATED APPLICATIONS

The present application claims priority to Taiwan Patent Application No. 104204856 filed on Mar. 31, 2015, incorporated herein by reference in its entirety.

FIELD OF THE INVENTION

The present invention relates to a packaging structure for a laser diode, specifically, relating to a packaging structure which is a heat-conducting component capable of creating a larger heat-conducting area of a faying plane between a submount for the laser diode chip and a heat-conducting base, so that the heat generated by the laser diode can be rapidly and effectively conducted and dissipated.

BACKGROUND OF THE INVENTION

As shown in FIG. 1, a conventional packaging structure for a laser diode 10, comprises: a laser diode chip 110, an optical axis 101 of a light beam center capable of emitting a cone-shaped laser beam 100, a submount 120, and a heat-conducting base 130, wherein the submount 120 and the heat-conducting base 130 are made of copper alloys, the laser diode chip 110 is a semiconductor chip, both of which are often bonded by an adhesive 118. The submount 120 is loaded with the laser diode chip 110 and conducts heat to the heat-conducting base 130, wherein the heat-conducting base 130 is not large. As a result, the air contact area is not large enough to dissipate the heat to the air by itself and the heat has to be dissipated by a main surface of the heat-conducting base 192 contacting with a bigger external heat dissipating body 191 (e.g., a body shell made of aluminum or a specialized heat-dissipating fin). To improve the efficiency of heat dissipation, the main surface of the heat-conducting base 192 is required to be large and even, and it is common that the main surface of the heat-conducting base 192 is parallel to the surface of a window glass 105 (both of which are vertical to the optical axis 101) for installing the mounting mechanism of the window glass 105 and the main surface of the heat-conducting base 192, so that the contact area between the main surface of the heat-conducting base 192 and the external heat dissipating body 191 can be expanded to improve the heat-conducting efficiency. Those aforementioned mechanisms are common in the packaging for low or medium power laser diodes. However, the aforementioned packaging structure is difficult to be implemented for high-power laser diodes, because high-power laser diodes generate a much larger amount of heat. Furthermore, there are two or three pins next to the submount to connect the laser chip by gold wire bonding. Because the pins need to be as close to the laser chip as possible, there is no space for the submount to expand; hence the submount has to be as small as possible, rendering formation of a bottleneck throughout the entire heat-conducting pathway. As show in FIG. 1, the faying plane 190 (cross section A-A) between the submount 120 and the heat-conducting base 130 is too small and the heat-conducting area cannot be expanded. FIG. 2, including FIG. 2A and FIG. 2B, wherein the unit shown in the figures is mm, shows a packaging structure for a laser diode 20. FIG. 2A shows a conventional TO-5 packaging structure for a laser diode 20 comprising: a laser diode chip 210 which can emit a laser beam 200 having an optical axis 201, a submount 220, a heat-conducting base 230 and pins 227, wherein the maximum area of the faying plane 290 (cross section A-A) between the submount 220 and the heat-conducting base 230 is approximately 1.3 mm×3.3 mm=4.29 mm$^2$, no more than 6 mm$^2$. Because the area of the faying plane 290 (cross section A-A) between the submount and the heat-conducting base is so small that it becomes a bottleneck of the heat conduction, it is difficult to conduct the heat from the laser diode chip 210 to the heat dissipating body, that is, the heat is conducted by the heat-conducting base 230, through a main surface of the heat-conducting base 292 to an external heat dissipating body.

FIG. 2B shows another conventional C-Mount packaging structure for a laser diode 20', which comprises generally the same main components as shown in FIG. 2A, and the area of the faying plane 290 (cross section A-A) for heat conduction is 1.8×mm×2.0 mm=3.6 mm$^2$, no more than 6 mm$^2$. Meanwhile, in FIG. 1 and FIGS. 2A and 2B, the same components are denoted by changing the numbers from 1xx to 2xx.

According to physics, one skilled in the art should know that the rate of heat conduction is proportional to the heat-conducting area, and because the heat-conducting area of the submount provided by the conventional packaging structure for a laser diode (the aforementioned area of the faying plane) is too small, the large amount of heat generated by the laser diode chip is difficult to be dissipated through the submount to the heat-conducting base; furthermore, because the submount is installed in a limited space, the heat-conducting area cannot be expanded as necessary for improving the heat-conducting efficiency. The small heat-conducting area of the submount is the bottleneck of the heat conduction of the packaging of laser diodes.

Furthermore, as shown in FIG. 1 and FIG. 2, the conventional laser diodes are packaged cylindrically and individually, as previously discussed the heat-conducting area of the submount cannot be expanded inside the package, and there is no space to accommodate another laser diode chip, nor other electronic components. Apparently, the conventional packaging is not suitable for a device that needs more than one laser diode, and there is no space for installing other electronic components to improve performance.

Also, FIG. 1 and FIG. 2 show conventional packaging structures for laser diodes 10 and 20, wherein an optical axis 101, 201 of the laser beam 100, 200 is emitted vertically to the main surface of the heat-conducting base 192, 292, rather than being emitted in parallel. Besides, the existing packaging methods for laser diodes cannot provide additional space in the existing packaging structure to improve the performance of the laser diode, for example, an additional photo diode for detecting the optical power of laser diodes, an electrostatic discharge protection diode, and/or a reverse bias voltage protection diode. Besides, one skilled in the art also knows the LED chip emits light from the upfront surface instead of edge, it is easy for the LED to be packaged on a large plate for large amount heat dissipation; however, most of the laser diode chips emit light from the edge instead of the upfront surface, it is difficult for them to be packaged on a large plate. Consequently, conventional laser diode chips that emit light from the edge are not packaged on a large plate and cannot be provided with large size heat-conducting components.

Therefore, there is a high demand for a packaging structure which can solve the problems that conventional packaging structures for laser diodes have, especially the heat-conducting problems associated with packaging structures for medium or high power laser diode chips which emit light from the edge and generate large amount of heat.

DESCRIPTION OF THE INVENTION

The present invention provides an electrically insulated, heat-conducting board, when used as a component for packaging, it is similar to a submount (a component used for fixing and installing laser diode chips) of a conventional packaging structure for a laser diode, but totally different from a submount in its configuration, shape and size of the area.

One goal of the present invention is to provide a packaging structure for a laser diode chip, especially one used for a medium or high power laser diode, the packaging structure has a larger faying plane between an electrically insulated, heat-conducting board and a heat-conducting base, and the area size of the faying plane can be adjusted according to the power of the laser diodes, their shapes can be rectangular, square or irregular, which can efficiently and rapidly conduct and dissipate the heat generated by the laser diodes to extend the service life of the laser diodes. Besides, the output optical power of the laser diodes can be increased at the same driving current since the heat dissipation has been improved.

Another goal of the present invention is to provide a packaging structure for a laser diode, wherein the optical axis of the laser diodes is generally parallel to the surface of the electrically insulated, heat-conducting board, and the assembling process is simpler and the cost for assembling is decreased.

Another goal of the present invention is to provide a packaging structure for a laser diode, in which there is a space for additional devices, such as a photo diode to measure the optical power of the laser diode, a reverse bias voltage protection diode, and/or an electrostatic discharge protection diode to improve the performance and to extend the service life of the laser diode.

Another goal of the present invention is to provide a packaging structure for a laser diode, wherein the electrically insulated, heat-conducting board and the heat-conducting base are coincided into a single electrically insulated, heat-conducting component, which can conduct and dissipate the heat rapidly and efficiently and reduce the packaging cost.

A packaging structure for a laser diode according to the present invention comprises: an electrically insulated, heat-conducting board having an electronic circuit thereon; a laser diode chip mounted on the electronic circuit of the electrically insulated, heat-conducting board and having an anode and a cathode which are respectively connected to an external soldering pad for external electrical connections; and a heat-conducting base installed on a surface of the electrically insulated, heat-conducting board, which is used to dissipate the heat generated by the laser diode chip through the electrically insulated, heat-conducting board to the heat-conducting base, wherein the laser diode chip emits the light from the edge of the electrically insulated, heat-conducting board, and the area of the faying plane between the electrically insulated, heat-conducting board and the heat-conducting base is preferably from 6 to 5,000 mm$^2$ and can be adjusted according to the power requirements of the laser diodes. The present invention also relates to a packaging structure for a laser diode, comprising: an electrically insulated, heat-conducting board having an electronic circuit thereon; a laser diode chip mounted on the electronic circuit and having an anode and a cathode which are respectively connected to an external soldering pad for external electrical connections; and a heat-conducting base installed on a surface substantially parallel to the electrically insulated, heat-conducting board, which is used to dissipate the heat generated by the laser diode chip through the electrically insulated, heat-conducting board to the heat-conducting base, wherein the laser diode chip emits the light from the edge of the electrically insulated, heat-conducting board, and the optical axis of the laser diode chip is generally parallel to the surface of the electrically insulated, heat-conducting board.

BRIEF DESCRIPTION OF THE DRAWINGS

FIG. 4A is a physical structure top view diagram of the packaging structure for a laser diode shown in FIG. 3A.

FIG. 4B is a structural side view diagram of one aspect of the packaging structure for a laser diode shown in FIG. 4A.

FIG. 4C is a structural side view diagram of another aspect of the packaging structure for a laser diode shown in FIG. 4A.

DESCRIPTION OF THE EMBODIMENTS

The present invention may be implemented in many different forms and should not be construed as limited to the embodiments set forth herein; the following detailed description is only used for representing the different embodiments and characters of the present invention, therefore, should not be construed as the limitation of the claims.

Figure 1:
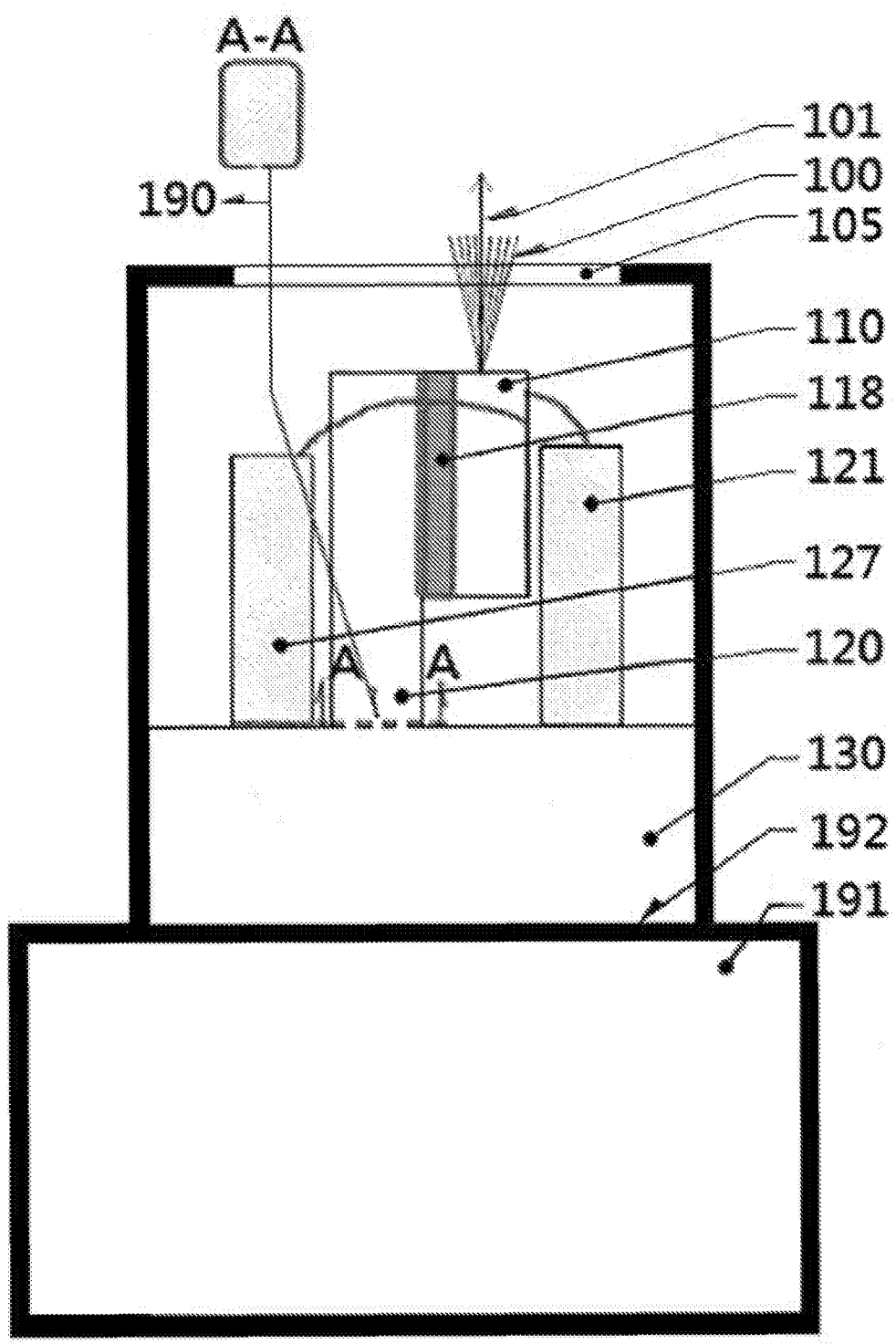
FIG. 1 is a schematic side view profile diagram of the entire structure of a conventional packaging structure for a laser diode 10.
Figure 2A:
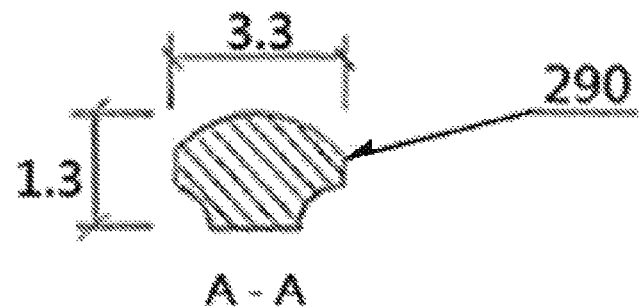
FIGS. 2A and 2B are respectively a schematic diagram of the entire structure of a conventional TO-5 packaging structure for a laser diode 20 and a conventional C-Mount packaging structure for a laser diode 20'.
Figure 2A:
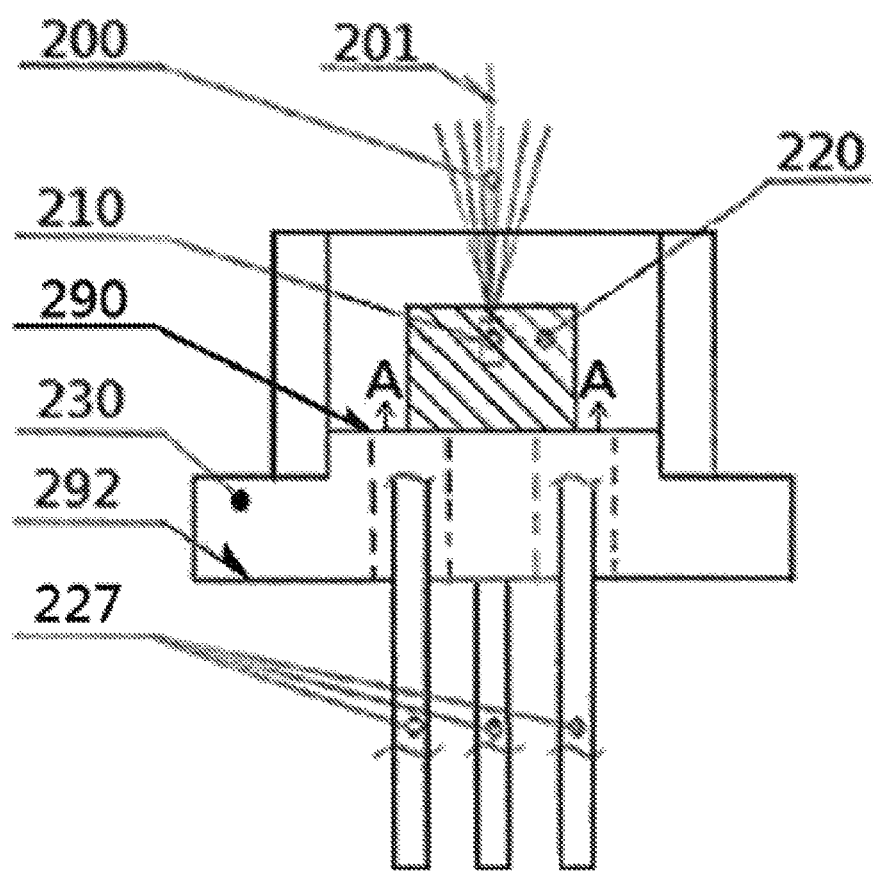
Figure 2B:
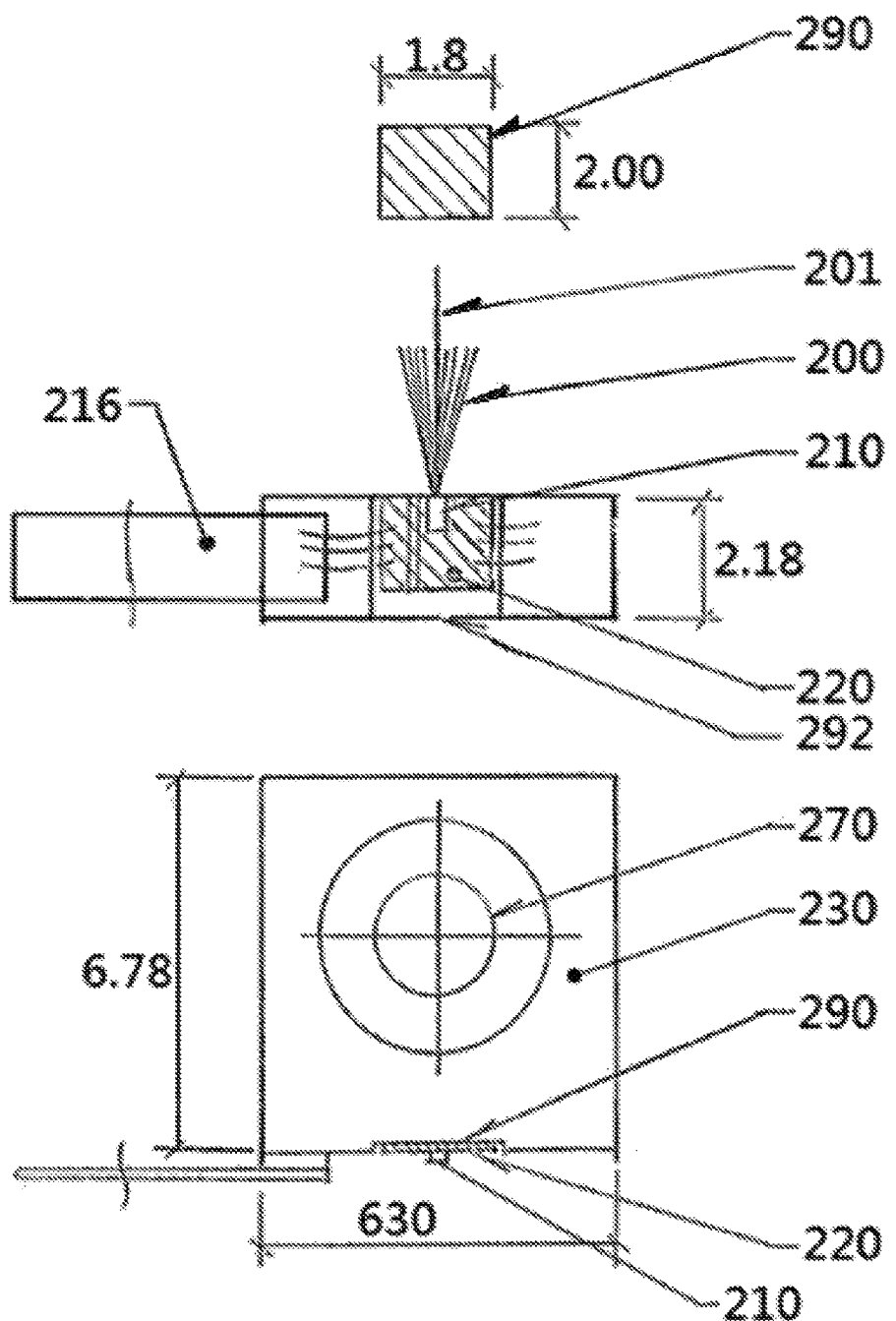
Figure 3A:
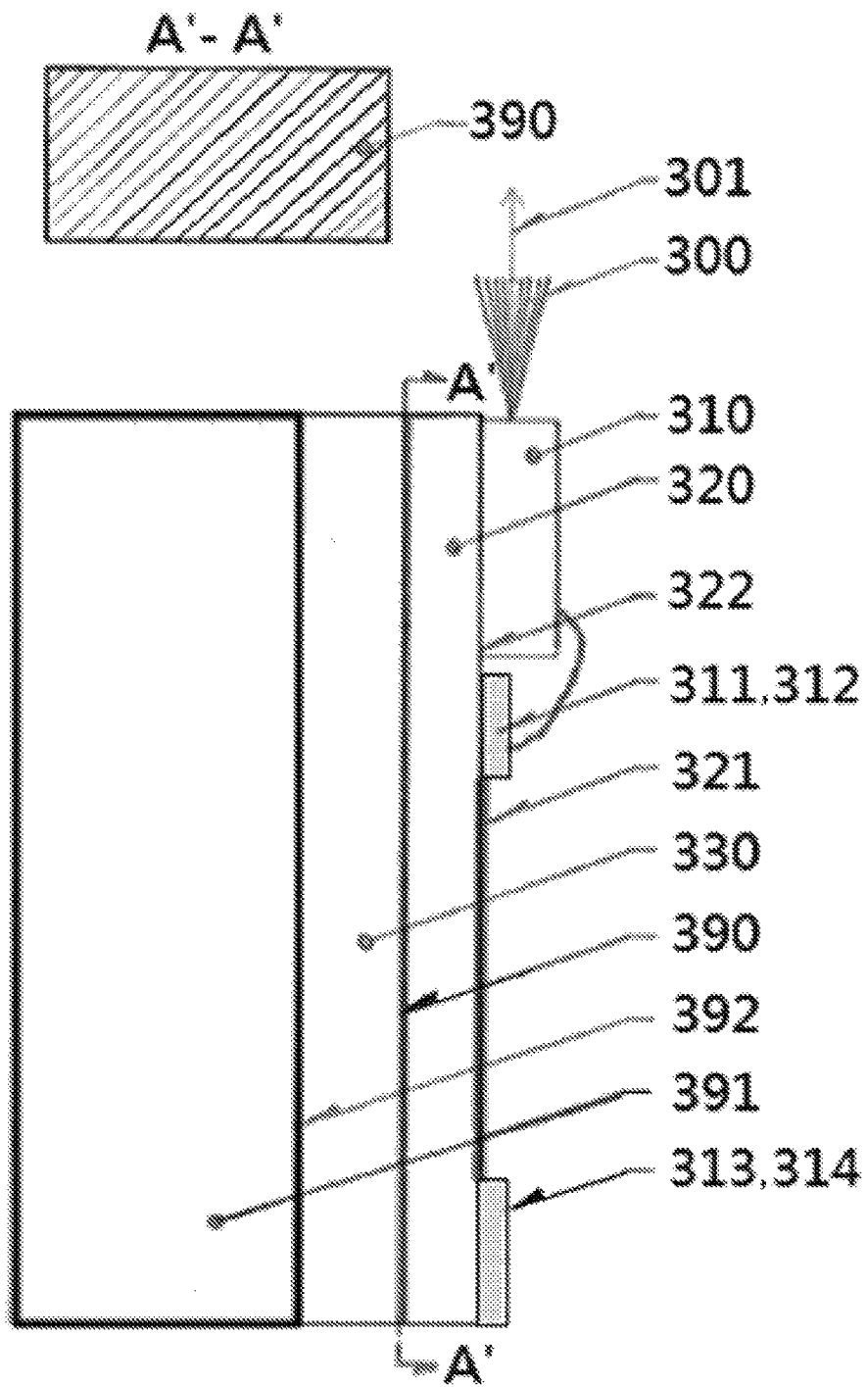
FIG. 3A is a side view schematic diagram of the entire structure of one embodiment of the packaging structure for a laser diode according to the present invention.

To overcome the bottleneck of the heat conduction associated with conventional packaging structures, that is, the area of the faying plane between a submount and a heat-conducting base is too small and cannot be adjusted according to the power requirements of the laser diode, the present invention provides a packaging structure for a laser diode 30 as shown in FIG. 3A, comprising: an electrically insulated, heat-conducting board 320 having an electronic circuit 321 thereon; a laser diode chip 310 mounted on the electronic circuit 321 of the electrically insulated, heat-conducting board 320 and having a soldering point 411 of the anode and a soldering point 412 of the cathode (as illustrated in FIG. 4A) respectively connected to, via the electronic circuit 321, an external soldering pad 313, 314 for external electrical connections; and a heat-conducting base 330 installed on a surface parallel to the electrically insulated, heat-conducting board 320, the surface is used to conduct the heat generated by the laser diode chip 310 to the heat-conducting base 330 through the electrically insulated, heat-conducting board 320 for dissipation, wherein the laser diode chip 310 emits cone-shaped laser beam 300 from the edge of the electrically insulated, heat-conducting board 320; the center of the light beam is an optical axis 301 which is generally parallel to the surface 322 of the electrically insulated, heat-conducting board 320 and/or generally parallel to a main surface of the heat-conducting base 392. The electrically insulated, heat-conducting board 320, used as a component for packaging, is analog to the submount of a conventional packaging structure for a laser diode, but different in physical structure. The size of the electrically insulated, heat-conducting board can be significantly extended according to the power dissipation requirements; for example, its length and width can be freely extended to 2.4 mm×2.4 mm, respectively, resulting in a heat-conducting area of 5.76 mm$^2$; or extended to 2 mm×3 mm or 3 mm×2 mm, resulting in a heat-conducting area of 6 mm$^2$; or extended to 6 mm×6 mm, resulting in a heat-conducting area of 36 mm$^2$; or extended to 70 mm×70 mm, resulting in a heat-conducting area of approximately 5,000 mm$^2$ (which is the faying plane as described below, cross section A'-A'). As a result, the area of the faying plane of the present invention can be freely adjusted from 6 to 5,000 mm$^2$, preferably from 10 to 5,000 mm$^2$, hence the heat-conducting area of the faying plane 390 (cross section A'-A') between the electrically insulated, heat-conducting board 320 and the heat-conducting base 330 is large enough so that the faying plane 390 is not a bottleneck of heat conduction anymore. Also, the current circuit board manufacturing technology can be used on the electrically insulated, heat-conducting board 320 to provide an electronic circuit 321 and soldering pads 311, 312 to connect the anode and the cathode of the laser diode chip to the electronic circuit, so that the electrically insulated, heat-conducting board 320 is not limited anymore by the pins and can be extended freely. For example, as to a single 1W laser diode, it is enough for the length and the width of the electrically insulated, heat-conducting board of one preferred embodiment to be 10 mm, respectively, and the area of a main surface of the heat-conducting base 392 to be 100 mm$^2$. Also, the electrically insulated, heat-conducting board 320 of the present invention can be extended significantly, which not only improves the heat-conducting efficiency, but also has the following advantages: 1. as to the structure of the present invention, the electrically insulated, heat-conducting board is large enough to provide a plurality of tapped holes which allows the electrically insulated, heat-conducting board to be fixed on the heat-conducting base by screws rather than by soldering, thereby enhancing the flexibility of the mechanism design and reducing the assembling cost; furthermore, the present invention does not require the conventional heat-conducting base, the electrically insulated, heat-conducting board, which has already packaged the laser diode chip, can be directly fixed on the aluminum external heat dissipating body; 2. since the surface area of the submount of the conventional laser diode is too small to accommodate any components (for example, the maximum surface area of the TO-18 packaging is 1.3 mm×1.85 mm=2.4 mm$^2$), there is little space for any other electronic component except the laser diode chip itself; the structure of the present invention allows the electrically insulated, heat-conducting board to easily accommodate other components, for example, a protection diode which protects the laser diode chip from electrostatic discharge or reverse bias voltage, and a photo diode for measuring optical power of the laser diode, both of which can be mounted on the electrically insulated, heat-conducting board by the same process, thereby extending the service life of the laser diode, reducing the cost, and minimizing the volume.

Figure 3B:
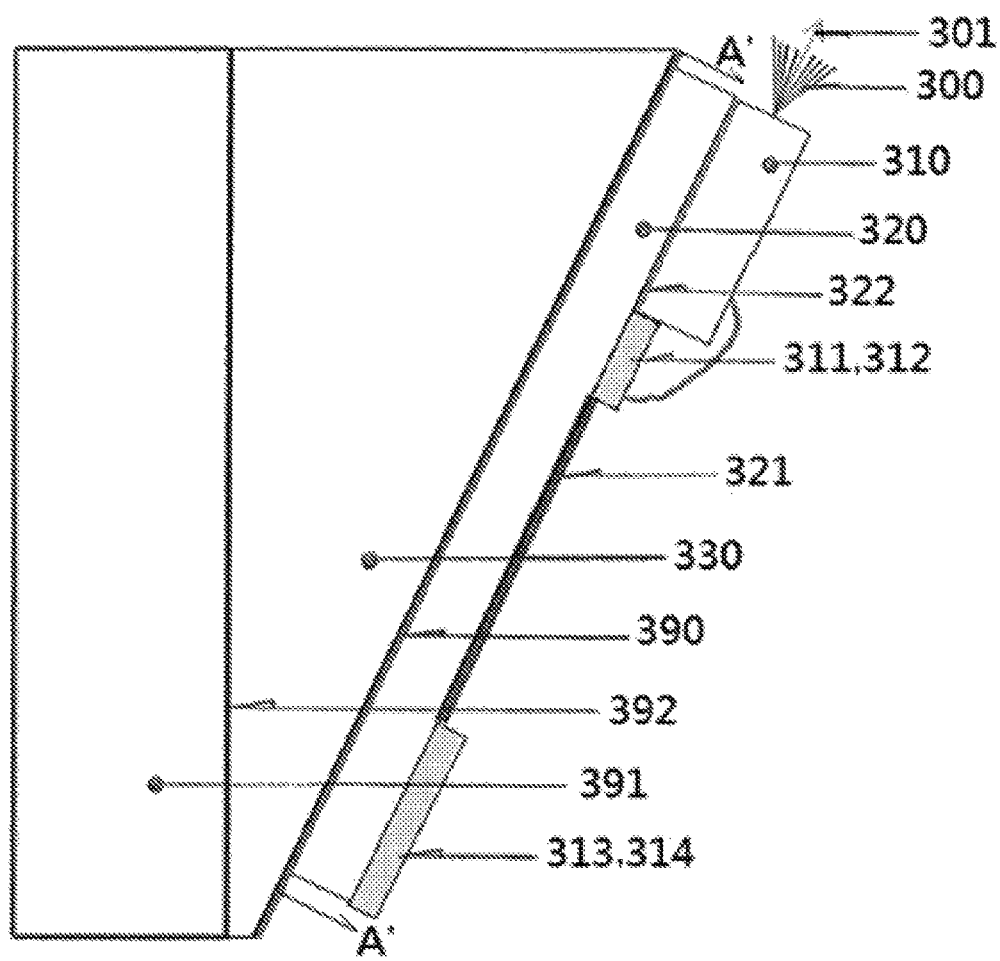
FIG. 3B is a side view schematic diagram of the structure of another embodiment of the packaging structure for a laser diode according to the present invention.

FIG. 3B is a schematic diagram of another embodiment of the packaging structure for a laser diode as shown in FIG. 3A. In FIG. 3B, the constituent components are the same as those shown in FIG. 3A, except that the electrically insulated, heat-conducting board 320 is not necessarily to be parallel to the main surface of the heat-conducting base 392 as shown in FIG. 3A, and depending on the application requirements of the optical axis 301, the heat-conducting base 330 can be designed together with the external heat dissipating body 391 to be in the shape of a trapezoid or in other shapes, causing an included angle between the electrically insulated, heat-conducting board 320 and the main surface of the heat-conducting base 392, i.e., the included angle between the optical axis 301 and the main surface of the heat-conducting base 392, changes accordingly from 0° to 180°. Also, depending on the power requirements of the laser diode, the present invention provides enough heat-conducting area to improve the heat-conducting efficiency, and the angle of the optical axis can be adjusted as necessary. As mentioned above, the optical axis of the conventional packaging structure is generally vertical to the main surface of the heat-conducting base, which does not allow any adjustments.

Embodiment: FIG. 4A is a physical structure diagram of one embodiment of the packaging structure for a laser diode according to the present invention, of which FIG. 3A is the schematic diagram. As the embodiment shown in FIG. 4A, a packaging structure for a laser diode 40 provided by the present invention, which is used for emitting a laser beam 400 having an optical axis 401, comprises an electrically insulated, heat-conducting board 420 (as mentioned above, which is analog to a submount of the conventional packaging for a laser diode) having an electronic circuit 421 thereon; a laser diode chip 410 mounted on the electronic circuit 421 and having a soldering point 411 of the anode and a soldering point 412 of the cathode, respectively connected to, via the electronic circuit 421, an external soldering pad 413, 414 for external electrical connections; and a heat-conducting base 430 installed on a surface of the electrically insulated, heat-conducting board 420, which surface is used to conduct the heat generated by the laser diode chip 410 to the heat-conducting base 430 through the electrically insulated, heat-conducting board 420 for dissemination, wherein the laser diode chip 410 emits the light from a edge of the electrically insulated, heat-conducting board 420, and a faying plane 490 (cross section A'-A') between the electrically insulated, heat-conducting board 420 and the heat-conducting base 430 can be adjusted depending on the power requirements of the laser diode, and the area of the faying plane can be from 6 to 5,000 mm$^2$. As mentioned above, the area of the faying plane (cross section A'-A') between the electrically insulated, heat-conducting board 420 and the heat-conducting base 430 can be substantially larger than the area of the faying plane (cross section A-A) between the conventional submount of a laser diode 120, 220 and the heat-conducting base 130, 230, and the shape and size of faying plane of the present invention can be adjusted to solve the bottleneck of the heat conduction associated with the conventional packaging—the narrowest heat-conducting area of the heat-conducting pathway.

In the present invention, as the packaging structure for a laser diode 40 shown in FIG. 4B, the heat-conducting base 430 and the laser diode chip 410 are respectively installed on opposite surfaces of the electrically insulated, heat-conducting board 420; as the packaging structure for a laser diode 40' shown in FIG. 4C, both the heat-conducting base 430 and the laser diode chip 410 are installed on the same surface of the electrically insulated, heat-conducting board 420, wherein the heat-conducting base 430 has a plurality of voids 480 which are used to receive the laser diode chip 410 and exposing the external soldering pads for external electrical connections.

In the present invention, the area of the heat-conducting base can be adjusted as necessary according to the power requirements of the laser diode, and the area of the faying plane (cross section A'-A') for heat conduction is from 6 to 5,000 mm², and of course, the maximum area can be further increased or decreased depending on the power requirements of the laser diode.

In a packaging structure for a laser diode 30' as shown in FIG. 3B, an electrically insulated, heat-conducting board 320 and a heat-conducting base 330 are coincided into one single body. In one embodiment of the invention, an angle is formed between the faying plane 390, which is between the electrically insulated, heat-conducting board 320 and the heat-conducting base 330, and the main surface of the heat-conducting base 392, wherein the angle is from 0° to 180°. The main surface of the heat-conducting base 392 is the faying plane between the heat-conducting base 330 and an external heat dissipating body 391.

According to the present invention, the electrically insulated, heat-conducting board 320, 420, and the heat-conducting base 330, 430 can be in the shape of a rectangle, a square or in an irregular shape.

In a packaging structure for a laser diode 40 as shown in FIG. 4A, there can be a plurality of laser diode chips 410, mounted on the electronic circuit, and each of the laser diode chips has an anode and a cathode respectively connected via the electronic circuit 421 to an external soldering pad for external electrical connections.

Other than a plurality of laser diode chips, a packaging structure for a laser diode 40 provided by the present invention can further comprise a photo diode 440, behind the opposite edge of the main laser-emitting edge, to measure the optical power of the laser diode. The photo diode 440 is connected to a feedback circuit (not shown in figures) to control the optical power of the laser diode. The present invention further comprises a reverse bias voltage protection diode 450 which is connected in parallel with and installed in a reverse direction of the laser diode to conduct electrical current to protect the laser diode when the reverse voltage across the electrodes of the laser diode exceeds a predetermined value. The present invention further comprises an electrostatic discharge protection diode 460 which connects in parallel with the laser diode to conduct electrical current to protect the laser diode when the voltage across the electrodes of the laser diode exceeds a predetermined value. The photo diode 440 has an anode and a cathode which is respectively connected to an external soldering pad 441, 442 which are installed on the electronic circuit for external electrical connections.

Further, in a packaging structure for a laser diode of the present invention, the heat-conducting base 430 further comprises a plurality of voids 480 which are used to receive additional electronic components, wherein the additional electronic component is a photo diode 440, a reverse bias voltage protection diode 450, and/or an electrostatic discharge protection diode 460.

In a packaging structure for a laser diode of the present invention, the electrically insulated, heat-conducting board 420 can be a ceramic board, an electrically insulated, heat-conducting graphite board, or an aluminum circuit board; the heat-conducting base can be a copper alloy plate, an aluminum alloy plate, an iron alloy plate, or a heat-conducting graphite plate, wherein the ceramic board is an aluminum nitride board or an aluminum oxide board.

In the present invention, the same symbols shown in FIGS. 4A, 4B and 4C represent the same components.

To sum up FIGS. 3A, 3B and 4A, the present invention provides a packaging structure for a laser diode 30 or 40, comprising: an electrically insulated, heat-conducting board 320 or 420 having an electronic circuit 321 or 421 thereon; a laser diode chip 310 or 410 mounted on the electronic circuit 321 or 421 of the electrically insulated, heat-conducting board 320 or 420 which have a soldering point 411 of the anode and a soldering point 412 of the cathode, respectively connected, via the electronic circuit 421, to an external soldering pad 313, 314, 413 or 414 for external electrical connections; and a heat-conducting base 330 or 430 installed on a surface 322 or 422 (as shown in FIG. 4C) of the electrically insulated, heat-conducting board 320 or 420 to conduct the heat generated by the laser diode chip 310 or 410 to the heat-conducting base 330 or 430 through the electrically insulated, heat-conducting board 320 or 420 for dissipation, wherein the laser diode chip 310 or 410 emits laser from the edge of the electrically insulated, heat-conducting board 320 or 420, and the optical axis 301 or 401 of the laser diode chips are generally parallel to the surface 322 or 422 of the electrically insulated, heat-conducting board 320 or 420.

In a packaging structure for a laser diode as shown in FIG. 4A and 4B, the heat-conducting base 430 and the laser diode chip 410 are respectively installed on different surfaces of the electrically insulated, heat-conducting board 420; as shown in FIG. 4C, the heat-conducting base 430 and the laser diode chip 410 also can be respectively installed on the same surface 422 of the electrically insulated, heat-conducting board 420, wherein the heat-conducting base 430 has a plurality of voids 480 which are used to receive the laser diode chip 410 and/or other electronic components, and to expose the soldering pads for external electrical connections.

Also, in the packaging structure for a laser diode of the present invention, there are a plurality of laser diode chips mounted on the electronic circuit and an anode and a cathodes of each laser diode chip is respectively connected via the electronic circuit to the soldering pad for external electrical connections.

Also, the packaging structure for a laser diode of the present invention can further comprise a photo diode 440 having soldering points 441, 442, the photo diode, for measuring the optical power of the laser diode, is installed behind the opposite edge of the main laser-emitting edge of the laser diode chip 410, and connected with a feedback circuit (not shown in the figures) to control the optical power of the laser diode. The present invention further comprises a reverse bias voltage protection diode 450 which is connected in parallel with and installed in a reverse direction of the laser diode to conduct electrical current to protect the laser diode when the reverse voltage across the electrodes of the laser diode exceeds a predetermined value. The present invention further comprises an electrostatic discharge protection diode 460 which connects in parallel with the laser diode to conduct electrical current to protect the laser diode when the voltage across the electrodes of the laser diode exceeds a predetermined value.

What is claimed is:
1. A packaging structure for a laser diode, comprises:
an electrically insulated, heat-conducting board having an electronic circuit thereon;
a laser diode chip mounted on the electronic circuit of the electrically insulated, heat-conducting board and having a soldering pad of an anode and a soldering pad of a cathode, respectively connected to, via the electronic circuit, an external soldering pad for external electrical connections; and a heat-conducting base installed on a surface of the electrically insulated, heat-conducting board, the surface being used to conduct heat generated by the laser diode chip to the heat-conducting base through the electrically insulated, heat-conducting board for dissipation, wherein the laser diode chip emits light from an edge of the electrically insulated, heat-conducting board, and wherein a faying plane between the electrically insulated, heat-conducting board and the heat-conducting base is adjusted depending on the power requirements of the laser diode, and the area of the faying plane is from 6 to 5,000 mm$^2$.

2. The packaging structure for a laser diode of claim 1, wherein the heat-conducting base and the laser diode chip are respectively installed on different surfaces of the electrically insulated, heat-conducting board.

3. The packaging structure for a laser diode of claim 1, wherein the heat-conducting base and the laser diode chip are respectively installed on the same surface of the electrically insulated, heat-conducting board, and wherein the heat-conducting base has a plurality of voids which are used to receive the laser diode chip and exposing the external soldering pads for external electrical connections.

4. The packaging structure for a laser diode of claim 1, wherein the electrically insulated, heat-conducting board and the heat-conducting base are coincided into one single body.

5. The packaging structure for a laser diode of claim 1, wherein the electrically insulated, heat-conducting board and the heat-conducting base is in a shape of a rectangle, a square or in an irregular shape.

6. The packaging structure for a laser diode of claim 1, wherein there are a plurality of laser diode chips mounted on the electronic circuit, and each of the plurality of the laser diode chips has an anode and a cathode respectively connected via the electronic circuit to an external soldering pad for external electrical connections.

7. The packaging structure for a laser diode of claim 1, further comprising a photo diode which is mounted on the electrically insulated, heat-conducting board and installed behind an opposite edge of a main laser-emitting edge to measure optical power of the laser diode.

8. The packaging structure for a laser diode of claim 1, wherein the electrically insulated, heat-conducting board further comprises a reverse bias voltage protection diode which is connected in parallel with and installed in a reverse direction of the laser diode to conduct electrical current to protect the laser diode when a reverse voltage across the electrodes of the laser diode exceeds a predetermined value.

9. The packaging structure for a laser diode of claim 1, wherein the electrically insulated, heat-conducting board comprises an electrostatic discharge protection diode which is connected in parallel with the laser diode to conduct electrical current to protect the laser diode when a voltage across the electrodes of the laser diode exceeds a predetermined value.

10. The packaging structure for a laser diode of claim 7, wherein the photo diode has an anode and a cathode respectively connected to an external soldering pad which is installed on the electronic circuit for external electrical connections.

11. The packaging structure for a laser diode of claim 3, wherein the heat-conducting base has a plurality of voids to receive additional electronic components on the electrically insulated, heat-conducting board.

12. The packaging structure for a laser diode of claim 11, wherein the additional electronic components is a photo diode, a reverse bias protection diode, and/or an electrostatic discharge protection diode.

13. The packaging structure for a laser diode of claim 1, wherein the electrically insulated, heat-conducting board is a ceramic board, an electrically insulated, heat-conducting graphite board, or an aluminum circuit board.

14. The packaging structure for a laser diode of claim 1, wherein the heat-conducting base is a copper alloy plate, an aluminum alloy plate, an iron alloy plate, or a heat-conducting graphite plate.

15. The packaging structure for a laser diode of claim 1, wherein the ceramic board is an aluminum nitride board or an aluminum oxide board.

16. A packaging structure for a laser diode, comprises:

an electrically insulated, heat-conducting board having an electronic circuit thereon;

a laser diode chip mounted on the electronic circuit and having a soldering point of an anode and a soldering point of a cathode, respectively connected to an external soldering pad for external electrical connections via the electronic circuit; and a heat-conducting base installed on and substantially parallel to a surface of the electrically insulated, heat-conducting board to conduct the heat generated by the laser diode chip to the heat-conducting base through the electrically insulated, heat-conducting board for dissipation, wherein the laser diode chip emits light from an edge of the electrically insulated, heat-conducting board and an optical axis of the laser diode chip is generally parallel to the surface of the electrically insulated, heat-conducting board.

17. The packaging structure for a laser diode of claim 16, wherein the heat-conducting base and the laser diode chip are respectively installed on different surfaces of the electrically insulated, heat-conducting board.

18. The packaging structure for a laser diode of claim 16, wherein the heat-conducting base and the laser diode chip are respectively installed on the same surface of the electrically insulated, heat-conducting board and the heat-conducting base has a plurality of voids to receive the laser diode chip and exposing the external soldering pads for external electrical connections.

19. The packaging structure for a laser diode of claim 16, wherein there is a plurality of laser diode chips mounted on the electronic circuit, each of the laser diode chips has an anode and a cathode respectively connected via the electronic circuit to an external soldering pad for external electrical connections.

20. The packaging structure for a laser diode of claim 16, wherein an included angle between the optical axis of a laser beam and a main surface of the heat-conducting base is from 0° to 180°.

21. The packaging structure for a laser diode of claim 16, which further comprises a photo diode installed behind an opposite edge of a main laser-emitting edge to measure optical power of the laser diode.

22. The packaging structure for a laser diode of claim 16, which further comprises a reverse bias voltage protection diode which is connected in parallel with and installed in a reverse direction of the laser diode to conduct electrical current to protect the laser diode when a reverse voltage across the electrodes of the laser diode exceeds a predetermined value.

23. The packaging structure for a laser diode of claim 16, which further comprises an electrostatic discharge protection diode which is connected in parallel with the laser diode to conduct electrical current to protect the laser diode when a voltage across the electrodes of the laser diode exceeds a predetermined value.

* * * * *